US009603294B2

(12) United States Patent
Suter et al.

(10) Patent No.: US 9,603,294 B2
(45) Date of Patent: Mar. 21, 2017

(54) APPARATUS FOR MOUNTING SEMICONDUCTOR CHIPS

(75) Inventors: Guido Suter, Geuensee (CH); Ruedi Grueter, Buttisholz (CH)

(73) Assignee: ESEC AG, Cham (CH)

( * ) Notice: Subject to any disclaimer, the term of this patent is extended or adjusted under 35 U.S.C. 154(b) by 178 days.

(21) Appl. No.: 13/614,622

(22) Filed: Sep. 13, 2012

(65) Prior Publication Data

US 2013/0133188 A1    May 30, 2013

(30) Foreign Application Priority Data

Nov. 25, 2011 (CH) ........................................ 1886/11

(51) Int. Cl.
H05K 13/04 (2006.01)
H01L 21/67 (2006.01)
H01L 23/00 (2006.01)

(52) U.S. Cl.
CPC ... H05K 13/0404 (2013.01); H01L 21/67144 (2013.01); H01L 24/75 (2013.01); H01L 2224/75701 (2013.01); H01L 2224/75702 (2013.01); H01L 2224/75804 (2013.01); H01L 2224/75822 (2013.01); Y10T 29/53178 (2015.01)

(58) Field of Classification Search
CPC ............. H05K 13/0404; H05K 13/046; H05K 13/0465; H05K 13/0469
USPC ........................... 29/739, 740, 743, 832, 741
See application file for complete search history.

(56) References Cited

U.S. PATENT DOCUMENTS 5,251,266 A * 10/1993 Spigarelli .............. H05K 13/08
29/721
5,765,277 A * 6/1998 Jin ..................... H05K 13/0404
228/6.2
(Continued)

FOREIGN PATENT DOCUMENTS

CN 1423316 A 6/2003
CN 1613146 A 5/2005
(Continued)

OTHER PUBLICATIONS

French Search Report in French Application No. 1260577, dated Aug. 14, 2015.
(Continued)

Primary Examiner — Peter DungBa Vo
Assistant Examiner — Kaying Kue
(74) Attorney, Agent, or Firm — Nixon Peabody LLP

(57) ABSTRACT

An apparatus includes a pick and place system with a bonding head, picking head and support table. The picking head and support table are mounted on a carriage. The apparatus can be operated in a direct mode and a parallel mode. In the direct mode the carriage is in a first position (parked). A control unit operates the pick and place system to cause the bonding head to move a series of semiconductor chips from the wafer table to the substrate. In the parallel mode, the carriage is in a second position. The control unit operates the picking head, support table and pick and place system to repeatedly cause the picking head to move a semiconductor chip from the wafer table to the support table and the bonding head to move said semiconductor chip from the support table to the substrate.

2 Claims, 6 Drawing Sheets

(56) References Cited

U.S. PATENT DOCUMENTS

| | | | |
|---|---|---|---|
| 6,171,049 B1 | 1/2001 | Wirz et al. | |
| 7,033,842 B2 * | 4/2006 | Haji | H01L 21/67144 228/19 |
| 7,047,632 B2 * | 5/2006 | Arikado | H01L 21/67144 29/825 |
| 7,146,718 B2 | 12/2006 | Thuerlemann | |
| 8,133,823 B2 * | 3/2012 | Behler | G05B 19/4015 257/E21.705 |
| 8,166,637 B2 * | 5/2012 | Blessing | H01L 21/67132 29/720 |
| 8,296,934 B2 * | 10/2012 | Lin | B32B 17/10807 29/739 |
| 2002/0124393 A1 * | 9/2002 | Suhara | H05K 13/0408 29/740 |
| 2003/0071109 A1 * | 4/2003 | Arikado | H01L 21/67144 228/180.1 |
| 2003/0177633 A1 * | 9/2003 | Haji | H01L 21/67144 29/743 |
| 2005/0006029 A1 | 1/2005 | Suzuki et al. | |
| 2005/0088666 A1 * | 4/2005 | Yakiyama | H01L 21/67144 356/614 |
| 2005/0210667 A1 * | 9/2005 | Yakiyama | H01L 21/67144 29/740 |
| 2009/0269178 A1 | 10/2009 | Trinks | |
| 2010/0122455 A1 * | 5/2010 | Noda | H01L 21/67144 29/832 |
| 2010/0257728 A1 * | 10/2010 | Hiraki | H01L 24/27 29/739 |

FOREIGN PATENT DOCUMENTS

| | | |
|---|---|---|
| CN | 101179031 A | 5/2008 |
| EP | 2 005 808 | 3/2010 |
| JP | 2003-86611 A | 3/2003 |
| JP | 4496007 B2 | 7/2010 |
| WO | 97/32460 | 9/1997 |
| WO | 2007/118511 | 10/2007 |
| WO | 2008/092798 A1 | 8/2008 |
| WO | 2009/047214 A2 | 4/2009 |

OTHER PUBLICATIONS

Search Report in Chinese Patent Application No. 201210483718.1, issued May 3, 2016.

* cited by examiner

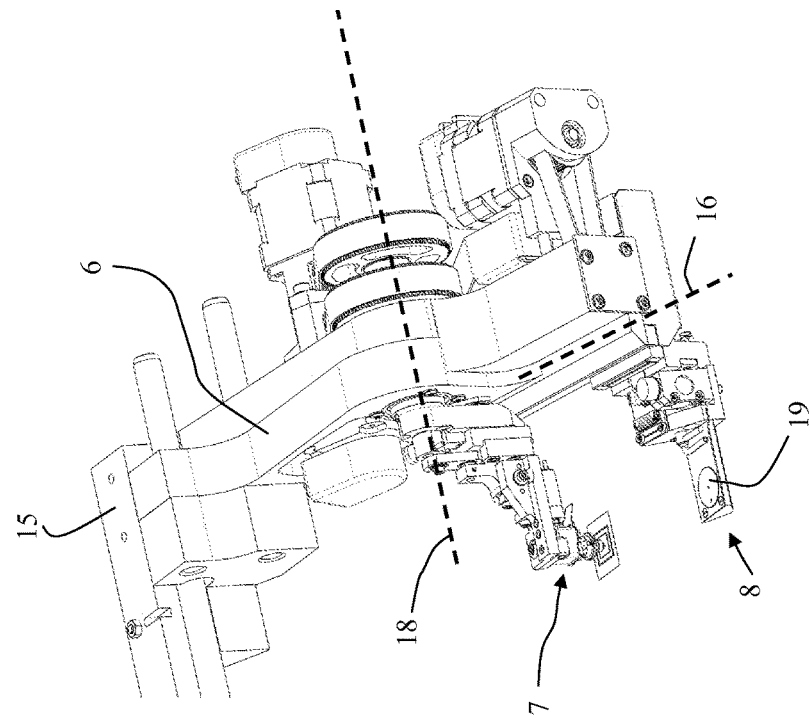
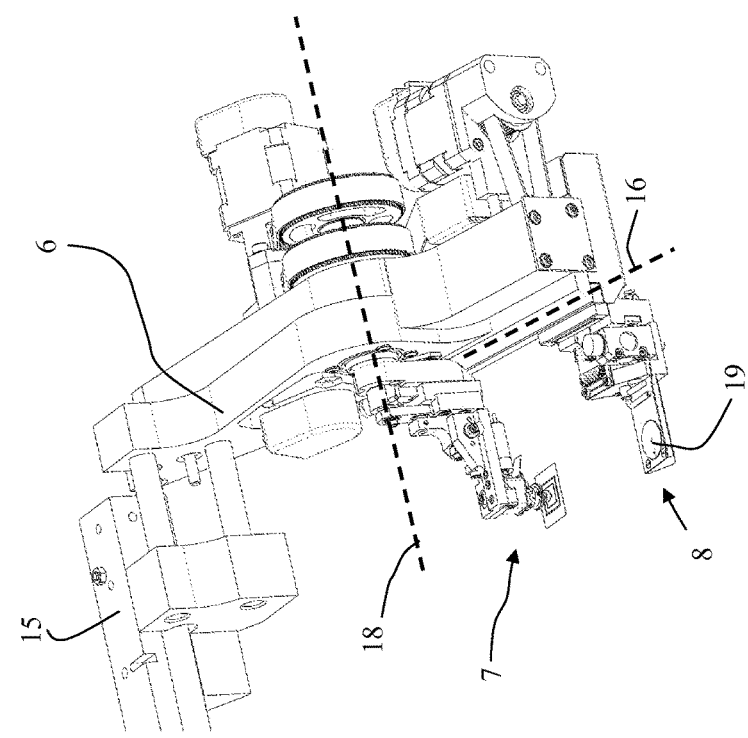

APPARATUS FOR MOUNTING SEMICONDUCTOR CHIPS

PRIORITY CLAIM

Applicant hereby claims foreign priority under 35 U.S.C §119 from Swiss Application No. 1886/11 filed Nov. 25, 2011, the disclosure of which is herein incorporated by reference.

FIELD OF THE INVENTION

The invention relates to an apparatus for mounting semiconductor chips.

BACKGROUND OF THE INVENTION

Such a semiconductor mounting apparatus, which is also known in the field as a "die bonder", is used for successively mounting the numerous similar semiconductor chips of a wafer which are known in the field as a "die" on a substrate or on another semiconductor chip in the case of so-called "stacked die" applications.

From U.S. Pat. No. 7,146,718 a semiconductor mounting apparatus is known which comprises a pick and place system which is set up to pick one semiconductor chip after the other from a wafer table and to place the same on a substrate location. The pick and place system comprises a single bonding head with which the semiconductor chip is taken from the wafer table, transported to the respective substrate location and bonded at the substrate location. This solution offers the advantage that the throughput of the machine for semiconductor chips which have a very short picking time and a very short bond time is very high. This solution comes with the disadvantage however that the throughput of the machine for semiconductor chips which have a comparatively long picking time of one second for example and a comparatively long bond time of also one second is very low. This solution comes with a further disadvantage that the chip gripper needs to fulfil the requirements in detaching the semiconductor chip from the wafer foil and also the requirements in bonding and cannot be constructed optimally for the individual processes.

Semiconductor mounting apparatuses are also known which comprise a picking head and a bonding head, with the picking head picking the semiconductor chip from the wafer table and depositing the same on a support, and with the bonding head taking the semiconductor chip from the support and bonding the same onto the substrate.

SUMMARY OF THE INVENTION

The invention is based on the object of developing an apparatus for mounting semiconductor chips which can be adjusted in a simple manner to meet the various requirements.

The apparatus for mounting semiconductor chips according to the invention comprises a pick and place system with a single bonding head, a single picking head, a support table, and a control unit. The picking head and the support table are mounted on a carriage. The carriage is movable in a reciprocating fashion between a first position and a second position. The apparatus is configured to operate in a direct mode and a parallel mode. In the direct mode, the carriage is in the first position and the control unit operates the pick and place system in such a way that the bonding head removes one semiconductor chip after the other from the wafer table and places the same on the substrate. In the parallel mode, the carriage is in the second position and the control unit operates the picking head, the support table and the pick and place system in such a way that the picking head removes one semiconductor chip after the other from the wafer table and places the same on the support table, and the bonding head removes one semiconductor chip after the other from the support table and places the same on the substrate. The first position is a parking position in which the support table and the picking head are outside of the working area of the bonding head of the pick and place system.

The apparatus preferably has only two cameras, namely a first camera and a second camera. The apparatus is constructed such that the support table is movable in a reciprocating fashion between a first end position and a second end position. In the parallel mode of operation, the control unit is configured to move the support table to the first end position in which the picking head places the removed semiconductor chip on the support table, and then to move the support table to the second end position in which the bonding head removes the semiconductor chip from the support table. The field of view of the first camera is directed towards a removal location on the wafer table. The second camera is displaceably mounted in order to direct the field of view of the second camera towards the support table when the support table is in its second end position, or towards the substrate location on which the semiconductor chip is to be placed.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings:

FIG. 2 shows details of the apparatus, and

DETAILED DESCRIPTION OF THE INVENTION

Figure 1:
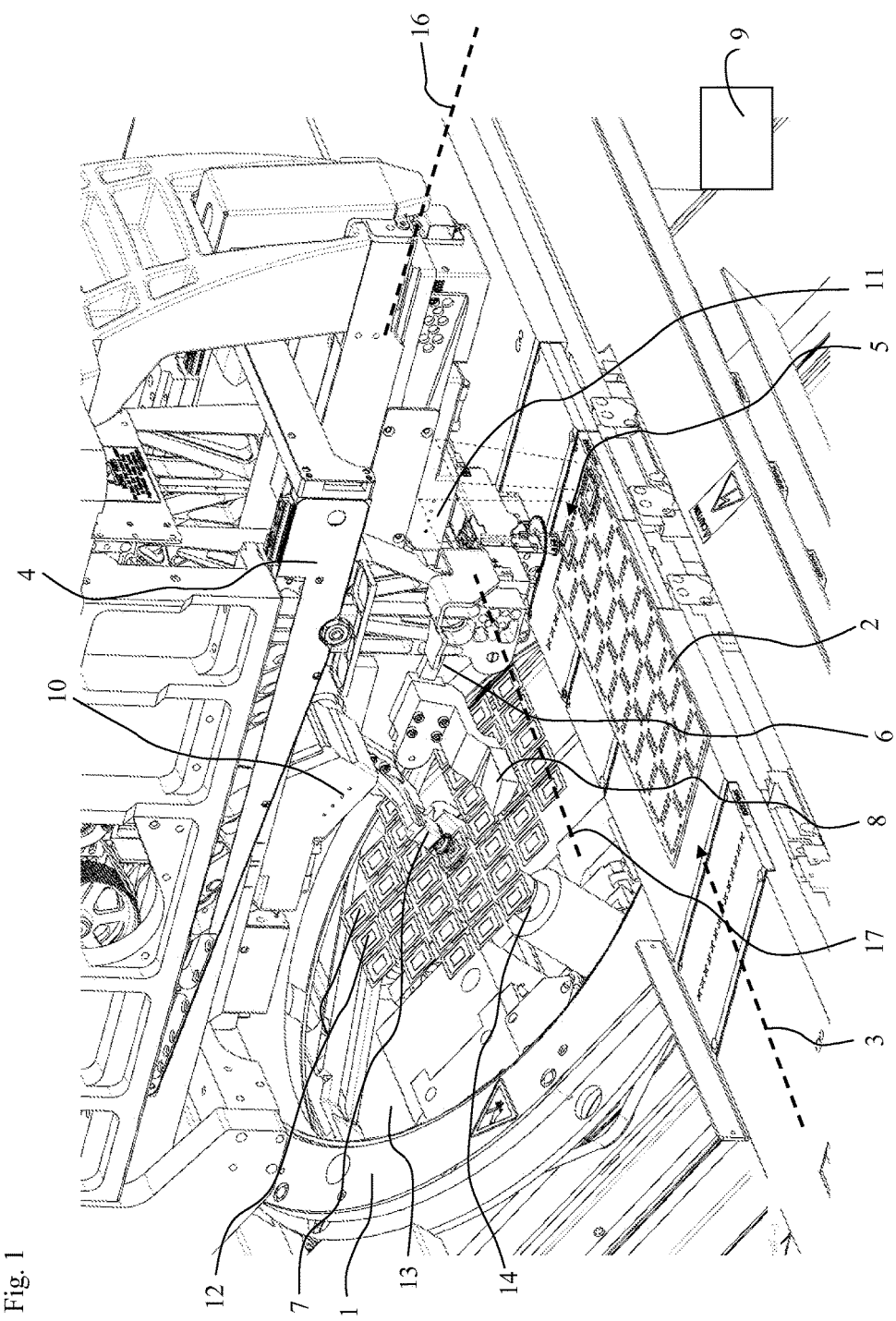
FIG. 1 shows the parts of an apparatus for mounting semiconductor chips which are required for understanding the invention.

FIG. 1 shows the parts of an apparatus for mounting semiconductor chips on substrates which are required for understanding the invention, i.e. a so-called automatic semiconductor mounting apparatus or die bonder, on the basis of a preferred embodiment. FIGS. 2A and 2B show details of the apparatus. The apparatus comprises a wafer table 1, a transport device for transporting the substrates 2 in a predetermined transport direction 3, a pick and place system 4 with a single bonding head 5, a carriage 6 on which a single picking head 7 and a support table 8 are mounted, and a schematically shown control unit 9. Only two cameras 10 and 11 are provided in this preferred embodiment. The semiconductor chips 12 to be mounted adhere to a transparently illustrated carrier foil 13. They are arranged in rows and columns adjacent to one another. The wafer table 1 can be moved in two orthogonal directions and is rotatable about its center point, with the wafer table 1 providing the next semiconductor chip 12 to be mounted at a fixed removal location A. The wafer table 1 comprises a chip ejector 14, also called die ejector, which supports the detachment of the semiconductor chips 12 from the carrier foil 13. The carriage 6 is movable in a reciprocating fashion between a first position and a second position. The carriage 6 is therefore mounted in a displaceable and/or rotatable manner and can be moved by means of a drive, e.g. an electrical, pneumatic or hydraulic drive, from the first position to the second position and vice versa. The first position of the carriage 6 which is shown in FIG. 2A is a parking position for the direct mode as will be explained below in closer detail, in which the picking head 7 and the support table 8 are disposed outside of the working area of the bonding head 5 of the pick and place system 4. The second position of the carriage 6 which is shown in FIG. 2B is a working position for the parallel mode as explained below in closer detail. In this embodiment, the carriage 6 is displaceably mounted in a predetermined direction on a stationary carrier 15. The predetermined direction extends in this example parallel to the transport direction 3 of the substrates 2.

The pick and place system 4 is set up to position the semiconductor chip 12 which is gripped by the bonding head 5 at a predetermined location $B_1$ or $B_2$ or . . . $B_n$ on a substrate 2, with the index n designating the number of substrate locations which are adjacently arranged on the substrate 2.

In accordance with the invention, the apparatus is configured to operate either in a direct mode or in a parallel mode.

In the direct mode:
the carriage 6 is in the first position;
the control unit 9 operates the pick and place system 4 in such a way that the bonding head 5 removes one semiconductor chip 12 after the other from the wafer table 1 and places the same on the substrate 2.

The picking head 7 and the support table 8 are therefore not used in the direct mode.

In the parallel mode:
the carriage 6 is in the second position;
the control unit 9 operates the picking head 7, the support table 8 and the pick and place system 4 in such a way that the picking head 7 removes one semiconductor chip 12 after the other from the wafer table 1 and places the same on the support table 8, and the bonding head 5 removes one semiconductor chip 12 after the other from the support table 8 and places the same on the substrate 2.

Some details of the preferred embodiment will be described below:

The wafer table 1 is arranged in an angular manner with respect to the plane of the substrate 2. The bonding head 5 is displaceable in a direction 16 extending orthogonally to the transport direction of the substrates and is pivotable between two predetermined pivoting positions in a reciprocating fashion about an axis 17 extending parallel to the transport direction 3 of the substrates 2 about an angle φ. In order to remove the semiconductor chip 12 provided on the wafer table 1 at the removal location A, the bonding head 5 is moved to a predetermined position and pivoted into the first predetermined pivoting position. In order to place the removed semiconductor chip 12 on the substrate, the bonding head 5 is moved to a respective position above the substrate and is pivoted about the angle φ to the second predetermined pivoting position. Further details of such an arrangement are disclosed in the patent specification U.S. Pat. No. 7,146,718.

The picking head 7 mounted on the carriage 6 can be pivoted between two predetermined pivoting positions in a reciprocating fashion about an axis 18 extending parallel to the transport direction 3 of the substrates 2 about the angle φ, like the bonding head 5 of the pick and place system 4. The support table 8 mounted on the carriage 6 is aligned parallel to the plane of the substrates 2 and is movable in a reciprocating fashion along the direction 16 between two predetermined end positions. A support surface 19 of the support table 8 is rotatable about an axis extending perpendicularly to the support surface 19, so that the orientation of the semiconductor chip 12 can be changed if required. The electrical or hydraulic drives required for the operation of the picking head 7 and the support table 8 are also fixed to the carriage 6, but will not be explained here in closer detail.

The first camera 10 is arranged in a stationary manner and its field of view is directed towards the removal location A of the semiconductor chip 12 on the wafer table 1. The second camera 11 is movable in a reciprocating fashion along the direction 16. Its field of view can be directed by displacement towards the support table 8 when it is located in the second end position or towards the substrate location on which the semiconductor chip 12 is to be placed.

Figure 3:
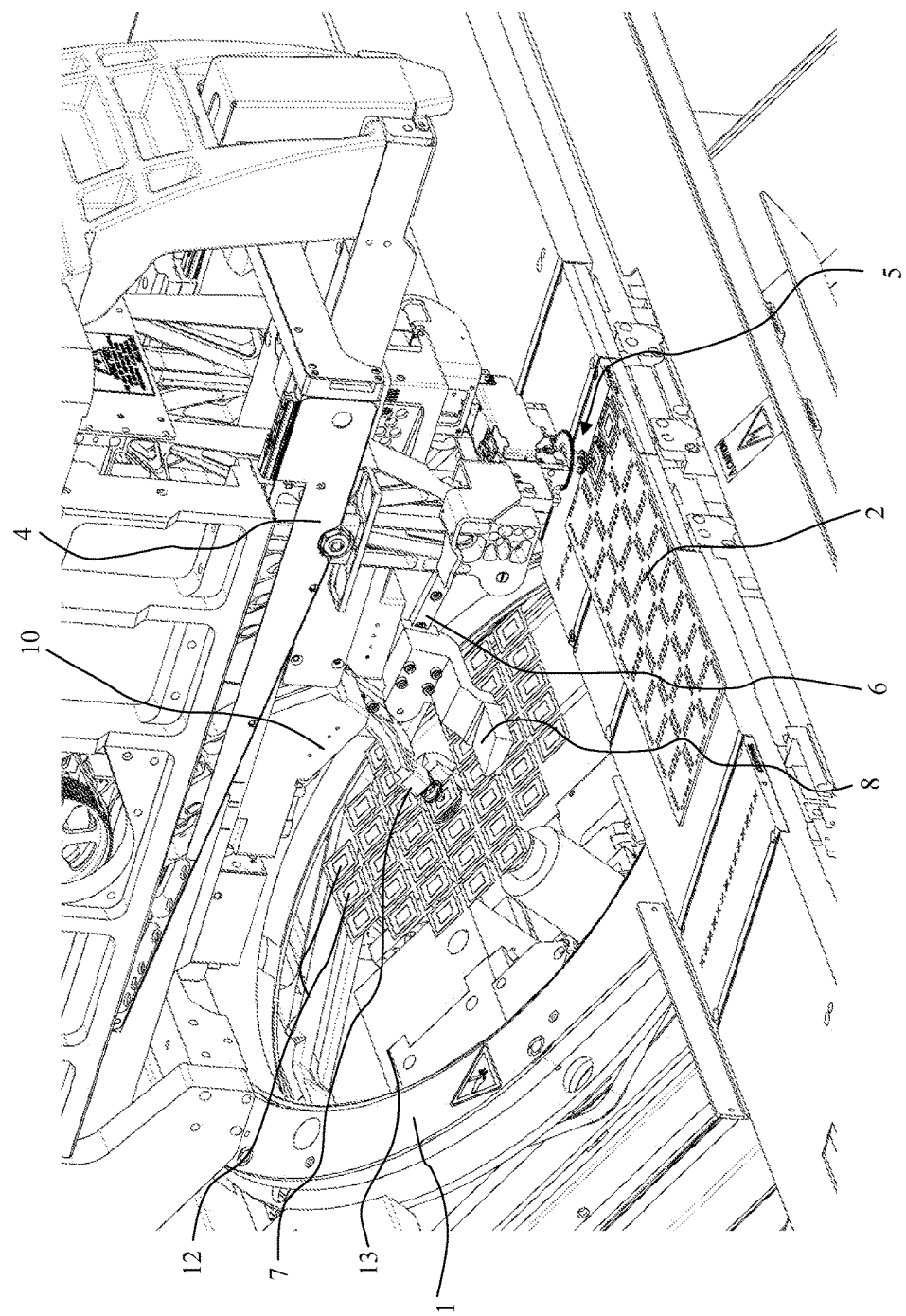
FIGS. 3-6 show snapshots during a mounting process.
Figure 4:
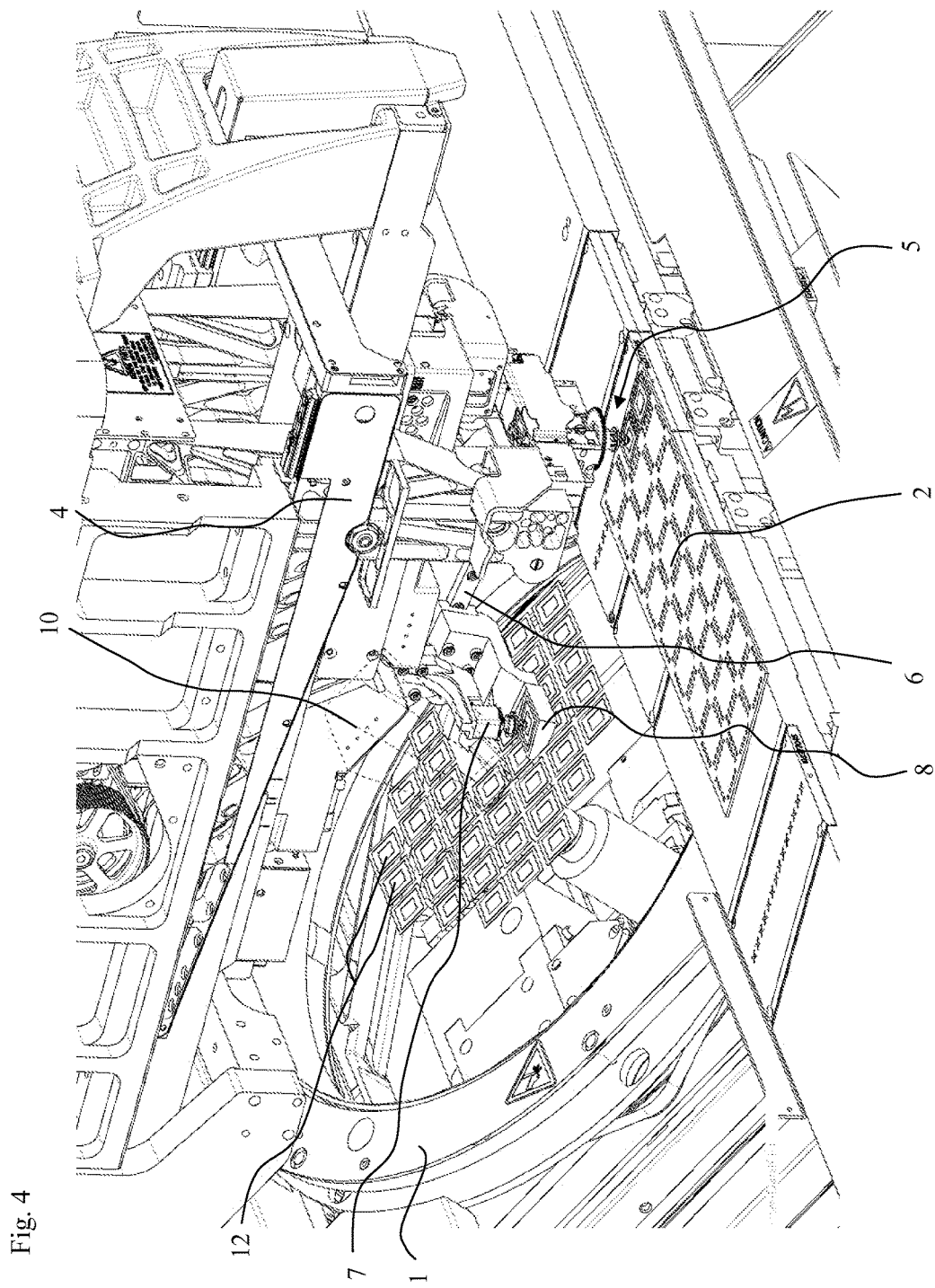
Figure 5:
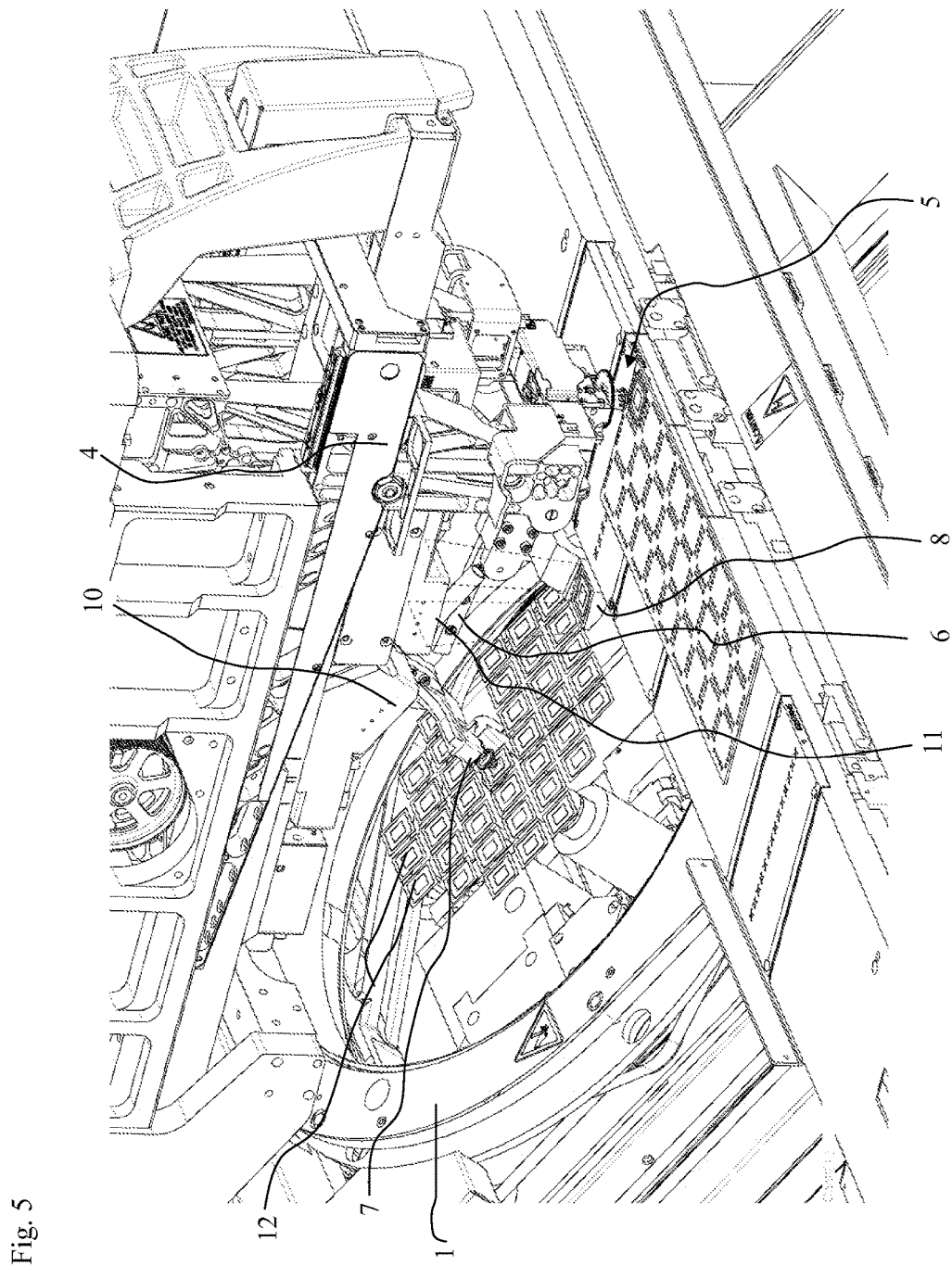
Figure 6:

The operation of this preferred embodiment in the parallel mode will be explained below in closer detail. The following steps are performed in order to remove a semiconductor chip 12 from the wafer table 1 and to place the same on the selected substrate location:

Moving the wafer table 1 in order to provide the next semiconductor chip 12 at the removal location A.
Taking a picture of the provided semiconductor chip 12 with the first camera 10.
Pivoting of the picking head 7 to its first pivoting position and removal of the provided semiconductor chip 12 from the wafer table 1.
Moving the support table 8 to its first end position.
This state is shown in FIG. 3.
Pivoting of the picking head 7 to its second pivoting position and placing the semiconductor chip 12 on the support table 8.
Moving the wafer table 1 in order to provide the next semiconductor chip 12 at the removal location A.
Taking a picture of the provided semiconductor chip 12 with the first camera 10. The field of view of the first camera 10 is shown with dashed lines.
This state is shown in FIG. 4.
Moving the support table 8 to its second end position.
Displacing the second camera 11 to the position in which its field of view is directed towards the support table 8.
Rotating the support table 8 if necessary in order to align the semiconductor chip 12 in a predetermined orientation.
Taking a picture of the semiconductor chip 12 disposed on the support table 8 with the second camera 11. The field of view of the second camera 11 during the recording is shown with dashed lines.
This state is shown in FIG. 5.
Displacing the second camera 11 to the position in which its field of view is directed towards the substrate location where the semiconductor chip 12 is to be placed.
Moving the bonding head 5 to the support table 8 and removing the semiconductor chip 12 from the support table 8.
Taking a picture of the substrate location with the second camera 11 on which the semiconductor chip 12 is to be placed. The field of view of the second camera 11 during the recording is shown with the dashed lines.
This state is shown in FIG. 6.
Optionally for quality control, taking a picture of the substrate location with the second camera 11 on which the preceding semiconductor chip 12 was placed.

Moving the bonding head 5 to the substrate location and placing the semiconductor chip 12 on the substrate location.

The position of the semiconductor chip 12 on the support table 8 and the position of the substrate location will be determined from the images recorded by the cameras 10 and 11 and the precise travelling paths of the bonding head 5 will be calculated therefrom, so that the bonding head 5 is able to place the semiconductor chip 12 in precise location on the substrate location. The bonding head 5 is always in the same pivoting position in parallel mode. The cameras 10 and 11 preferably take their pictures at points in time where the picking head 7, the pick and place system 4 and the bonding head 5 are not moving.

These steps can be performed partly in parallel on the one hand and partly in exchanged sequence on the other hand.

The described embodiment is a preferred embodiment of the invention. The semiconductor mounting apparatus in accordance with the invention can also be arranged in another manner within the scope of the claims, with the claims stating how the individual parts of the mounting apparatus need to be configured and cooperate. The term "substrate" shall be interpreted in a broad sense within the terms of the description and the claims, i.e. the substrate can be a substrate for example on which a semiconductor chip has already been mounted, whereupon a further semiconductor chip will be mounted on the already mounted semiconductor chip. Examples for this are the so-called "stacked dies" applications which are used in memory chips for example.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. Apparatus for mounting semiconductor chips, comprising a pick and place system with a single bonding head, a wafer table, a single picking head, a support table, and a control unit, wherein the picking head and the support table are mounted on a carriage, the carriage is movable in a reciprocating fashion between a first position and a second position, and wherein the apparatus is configured to operate in a direct mode and a parallel mode, wherein in the direct mode: the carriage is configured to operate in the first position which is a parking position in which the support table and the picking head are outside of the working area of the bonding head of the pick and place system, the control unit is configured to operate the pick and place system in such a way that the bonding head repeatedly removes a semiconductor chip from the wafer table and places the semiconductor chip on a substrate, in the parallel mode: the carriage is configured to operate in the second position, and the control unit is configured to operate the picking head, the support table and the pick and place system repeatedly in a way in which the picking head is configured to remove the semiconductor chip from the wafer table and to place the semiconductor chip directly on the support table mounted on the carriage, and the bonding head is configured to remove the semiconductor chip directly from the support table mounted on the carriage and to place the semiconductor chip on the substrate.

2. Apparatus according to claim 1, the apparatus further comprising a first camera and a second camera, wherein
the support table is movable in a reciprocating fashion between a first end position and a second end position,
in the parallel mode the control unit is configured to move the support table to the first end position in which the picking head is configured to place the removed semiconductor chip on the support table, and then to move the support table to the second end position in which the bonding head is configured to remove the semiconductor chip from the support table,
the field of view of the first camera is directed towards a removal location on the wafer table, and
the second camera is displaceably mounted in order to direct the field of view of the second camera towards the support table when the support table is in its second end position, or towards the substrate location on which the semiconductor chip is to be placed.

* * * * *